US008947636B2

(12) United States Patent
Cadee et al.

(10) Patent No.: US 8,947,636 B2
(45) Date of Patent: Feb. 3, 2015

(54) LITHOGRAPHIC APPARATUS, DEVICE MANUFACTURING METHOD, AND SUBSTRATE EXCHANGING METHOD

(75) Inventors: Theodorus Petrus Maria Cadee, Vlierden (NL); Jan Jaap Kuit, Veldhoven (NL); Johannes Catharinus Hubertus Mulkens, Valkenswaard (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 207 days.

(21) Appl. No.: 13/050,667

(22) Filed: Mar. 17, 2011

(65) Prior Publication Data
US 2011/0242518 A1    Oct. 6, 2011

Related U.S. Application Data

(60) Provisional application No. 61/319,531, filed on Mar. 31, 2010, provisional application No. 61/328,912, filed on Apr. 28, 2010, provisional application No. 61/351,665, filed on Jun. 4, 2010.

(51) Int. Cl.
G03B 27/58 (2006.01)
G03B 21/58 (2014.01)
G03F 7/20 (2006.01)

(52) U.S. Cl.
CPC ............ *G03B 21/58* (2013.01); *G03F 7/70733* (2013.01)
USPC .......................................................... 355/72

(58) Field of Classification Search
USPC .................................................... 355/72, 77
See application file for complete search history.

(56) References Cited

U.S. PATENT DOCUMENTS

| 5,715,064 A * | 2/1998 | Lin .............................. 356/401 |
| 6,262,796 B1 * | 7/2001 | Loopstra et al. ................ 355/53 |
| 2002/0132409 A1 * | 9/2002 | Akutsu et al. ................. 438/200 |
| 2003/0218730 A1 * | 11/2003 | Murakami et al. .............. 355/53 |

(Continued)

FOREIGN PATENT DOCUMENTS

| JP | 11-224854 | 8/1999 |
| JP | 2005/005295 | 1/2005 |
| JP | 2006-245484 | 9/2006 |

OTHER PUBLICATIONS

Japanese Office Action mailed Sep. 6, 2012 in corresponding Japanese Patent Application No. 2011-062035.

*Primary Examiner* — Peter B Kim
*Assistant Examiner* — Deoram Persaud
(74) *Attorney, Agent, or Firm* — Pillsbury Winthrop Shaw Pittman LLP (57) ABSTRACT

A lithographic apparatus includes an illumination system configured to condition a radiation beam; a support constructed to support a patterning device, the patterning device being capable of imparting the radiation beam with a pattern in its cross-section to form a patterned radiation beam; at least three substrate tables that are each constructed to hold a substrate; and a projection system configured to project the patterned radiation beam onto a target portion of the substrate, wherein the substrate tables are moveable in a common moving area extending substantially in a plane perpendicular to the patterned radiation beam, the moving area comprising at least three working locations of which at least one working location is arranged for exposure of the substrate to the patterned radiation beam and at least one working location is arranged for non-exposure purposes.

14 Claims, 6 Drawing Sheets

(56) References Cited

U.S. PATENT DOCUMENTS

| | | | |
|---|---|---|---|
| 2007/0291242 A1* | 12/2007 | Sato | 355/53 |
| 2008/0225261 A1* | 9/2008 | Hirayanagi | 355/72 |
| 2009/0002658 A1* | 1/2009 | Kiuchi | 355/53 |
| 2009/0033906 A1* | 2/2009 | Kumazaki | 355/72 |
| 2009/0128790 A1* | 5/2009 | Shibazaki | 355/53 |
| 2010/0026980 A1* | 2/2010 | Hirano et al. | 355/72 |
| 2010/0053588 A1* | 3/2010 | Binnard et al. | 355/77 |
| 2010/0245797 A1* | 9/2010 | Goodwin et al. | 355/72 |
| 2011/0102762 A1* | 5/2011 | Ichinose | 355/72 |
| 2011/0123913 A1* | 5/2011 | Yoshimoto | 430/30 |

* cited by examiner

LITHOGRAPHIC APPARATUS, DEVICE MANUFACTURING METHOD, AND SUBSTRATE EXCHANGING METHOD

CROSS REFERENCE TO RELATED APPLICATIONS

This application claims priority and benefit under 35 U.S.C. §119(e) to U.S. Provisional Patent Application No. 61/319,531, entitled "Lithographic Apparatus", filed on Mar. 31, 2010, U.S. Provisional Patent Application No. 61/328,912, entitled "Lithographic Apparatus, Device Manufacturing Method, and Substrate Exchanging Method", filed on Apr. 28, 2010, and U.S. Provisional Patent Application No. 61/351,665, entitled "Lithographic Apparatus, Device Manufacturing Method, and Substrate Exchanging Method", filed on Jun. 4, 2010. The contents of these applications are incorporated herein in their entirety by reference.

FIELD

The present invention relates to a lithographic apparatus, a device manufacturing method, and a method for exchanging a substrate between a substrate table and a substrate exchanger.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

It is desirable to provide an improved lithographic apparatus, in particular a lithographic apparatus with an increased throughput.

According to an embodiment of the invention, a lithographic apparatus is provided including an illumination system configured to condition a radiation beam; a support constructed to support a patterning device, the patterning device being capable of imparting the radiation beam with a pattern in its cross-section to form a patterned radiation beam; at least three substrate tables each constructed to hold a substrate; and a projection system configured to project the patterned radiation beam onto a target portion of the substrate, wherein the substrate tables are moveable in a common moving area extending substantially in a plane perpendicular to the patterned radiation beam, the moving area including at least three working locations of which at least one working location is arranged for exposure of the substrate to the patterned radiation beam and at least one working location is arranged for preparatory, i.e. non-exposure, purposes.

According to another embodiment of the invention, there is provided a device manufacturing method using a lithographic apparatus which includes: an illumination system configured to condition a radiation beam; a support constructed to support a patterning device, the patterning device being capable of imparting the radiation beam with a pattern in its cross-section to form a patterned radiation beam; at least three substrate tables each constructed to hold a substrate; and a projection system configured to project the patterned radiation beam onto a target portion of the substrate, wherein the substrate tables are moveable in a common moving area extending substantially in a plane perpendicular to the patterned radiation beam, the moving area including at least three working locations of which at least one working location is arranged for exposure of the substrate to the patterned radiation beam and at least one working location is arranged for preparatory, i.e. non-exposure, purposes, the method including:
1) transferring a pattern from a patterning device onto a substrate in a first working location;
2) exchanging a substrate between a substrate table and the substrate exchanger in a second working location; and
3) performing preparatory operations on a substrate in a third working location; wherein a substrate table is present in each of the first, second, and third working location so that the steps 1), 2) and 3) can be performed in parallel, and the method further including
4) moving the respective substrate table in the first working location to the second working location;
5) moving the respective substrate table in the second working location to the third working location;
6) moving the respective substrate table in the third working location to the first working location; wherein the steps 4), 5) and 6) are performed substantially simultaneously.

According to yet another embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate, wherein the substrate table is moveable in a common moving area extending substantially in a plane perpendicular to the patterned radiation beam; a projection system configured to project the patterned radiation beam onto a target portion of the substrate; and a substrate exchanger configured to exchange a substrate between the substrate table and the substrate exchanger while holding the respective substrate substantially stationary relative to the substrate exchanger with a substrate handling device seen in directions parallel to the plane, wherein the moving area of the substrate tables extends to the substrate exchanger so that the substrate table can move below the substrate handling device.

According to a further embodiment of the invention, there is provided a method to exchange a substrate between a substrate table and a substrate exchanger using a lithographic apparatus which includes: an illumination system configured to condition a radiation beam; a support constructed to support a patterning device, the patterning device being capable of imparting the radiation beam with a pattern in its cross-section to form a patterned radiation beam; a substrate table constructed to hold a substrate, wherein the substrate table is moveable in a common moving area extending substantially in a plane perpendicular to the patterned radiation beam; a projection system configured to project the patterned radiation beam onto a target portion of the substrate; and a substrate exchanger configured to exchange a substrate between the substrate table and the substrate exchanger while holding the respective substrate substantially stationary relative to the substrate exchanger with a substrate handling device seen in directions parallel to the plane,
wherein the moving area of the substrate tables extends to the substrate exchanger so that the substrate table can move below the substrate handling device,
the method including:
- moving the substrate table to below the substrate handling device;
- exchanging the substrate between the substrate table and the substrate exchanger;
- moving the substrate table away from the substrate exchanger.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
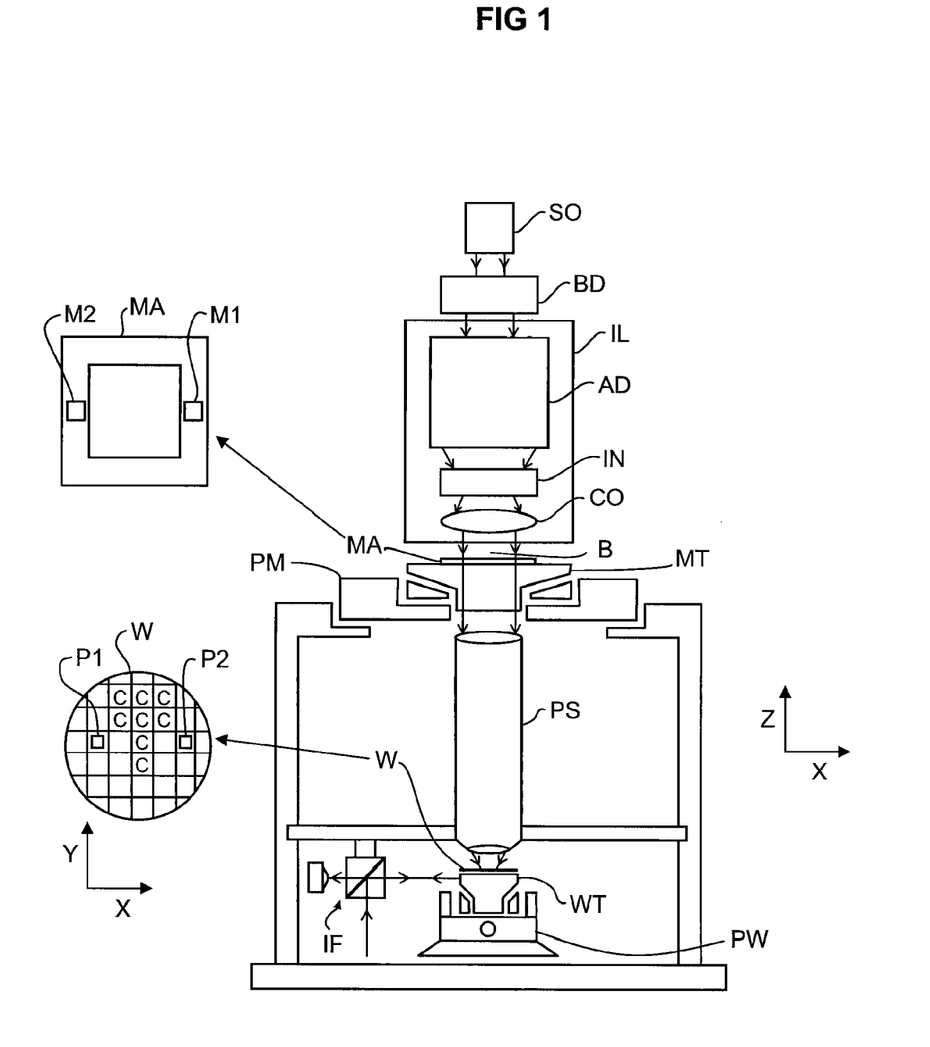
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive or catadioptric projection system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The embodiment of FIG. 1 includes in total three substrate tables WT of which only one is shown. Each substrate table WT is moveable in a common moving area extending substantially in a plane substantially perpendicular to the patterned radiation beam, for example, by a corresponding positioning device PW. This means that each substrate table can be moved in a direction substantially parallel to the plane, wherein the movement is bound by the (virtual or actual) borders of the moving area. It does not exclude the possibility of a substrate table to move substantially perpendicular to the plane. However, in one embodiment, the moving range substantially perpendicular to the plane will most of the time be small compared to moving ranges in directions substantially parallel to the plane.

Figure 2:
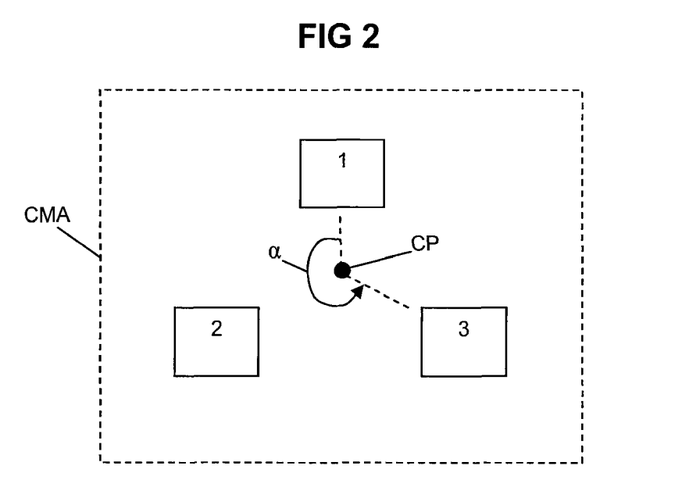
FIG. 2 depicts a common moving area with three working locations of a lithographic apparatus according to another embodiment of the invention.

An example of a possible moving area is shown in FIG. 2. FIG. 2 depicts a common moving area CMA indicated by the dashed lines. The moving area CMA includes three working locations 1, 2, 3 in which a substrate table can be positioned.

The working locations can be arranged for exposure of the substrate to the patterned radiation beam and/or for preparatory purposes. The preparatory purposes may include transfer from a substrate from or to a substrate table, or preparatory operations such as measuring parameters of the substrate, e.g. temperature, flatness, six degrees of freedom position information relative to the substrate table, etc. and/or adjusting the parameters of the substrate. At least one working location is arranged for the exposure and at least one working location is arranged for preparatory purposes.

It is explicitly noted here that an embodiment of the invention is especially suitable for lithographic apparatus of which at least two of the working location are arranged for exposure of the substrate, either via double optics or via stereo optics, and at least one of the working locations is arranged for measuring parameters of the substrate, e.g. six degree of freedom position information of the substrate relative to the substrate table.

The working locations are distributed around a central point CP. In an embodiment, the working locations are distributed evenly around the central point. In another embodiment, all angles between a line extending from the central point to a centre of one working location and a line extending from the central point to a centre of an adjacent working location on the side of the central point facing the other working location, of which one angle a is shown as an example in FIG. 2, are at least 180 degrees. In an embodiment, the distances of at least two working locations to the central point are equal. Possibly, all distances from the working locations to the central point are equal.

Figure 3:
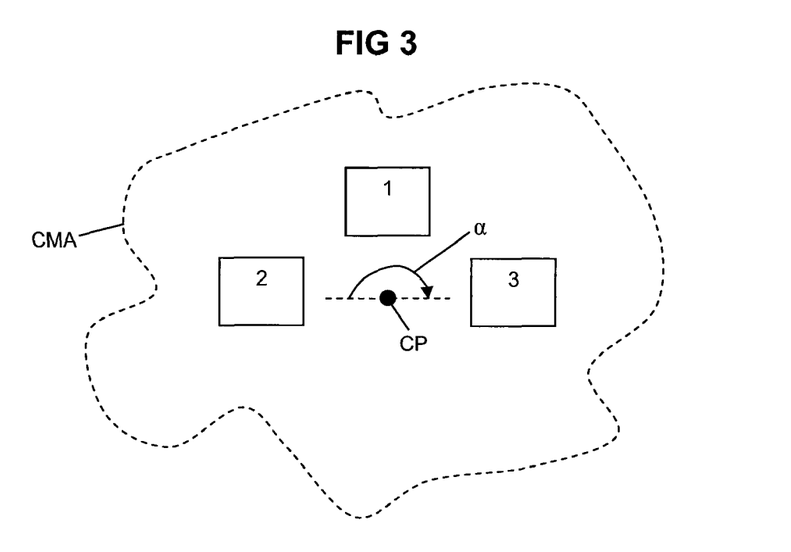
FIG. 3 depicts a common moving area with three working locations of a lithographic apparatus according to yet another embodiment of the invention.

FIG. 3 shows another example of a possible common moving area CMA. FIG. 3 shows that a common moving area CMA according to an embodiment of the invention can have any arbitrary shape, although in practice a rectangular or circular moving area may be desired. Also shown are three working locations 1, 2, 3, similar to the working locations of FIG. 2.

The working locations are distributed around a central point CP. In this example, one of the angles, in this case angle α, between adjacent working locations is near 180 degrees, the other angles are all larger than 180 degrees.

Figure 4:
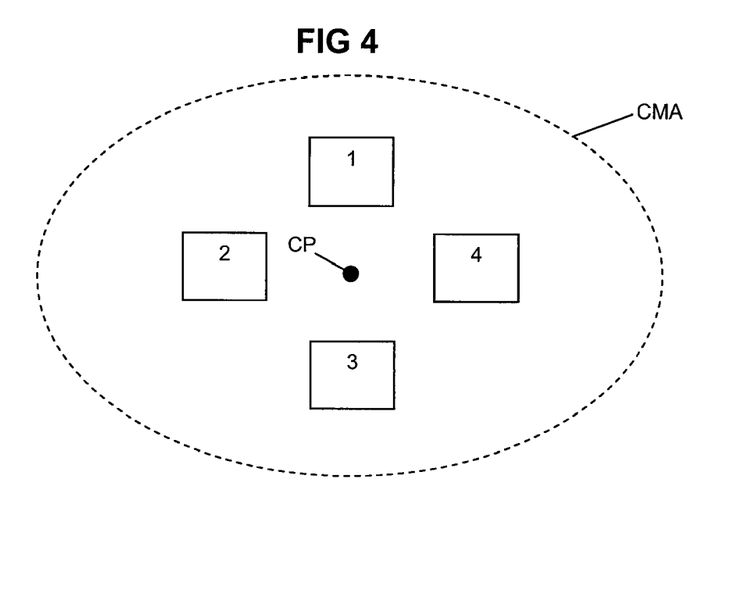
FIG. 4 depicts a common moving area with four working locations of a lithographic apparatus according to a further embodiment of the invention.

FIG. 4 depicts yet another example of a common moving area CMA, which in this embodiment is oval-shaped. In this example, there are four working locations 1, 2, 3, 4 provided which are distributed around the central point CP. In this example, the working locations are distributed in a point-symmetrical way.

Figure 5:
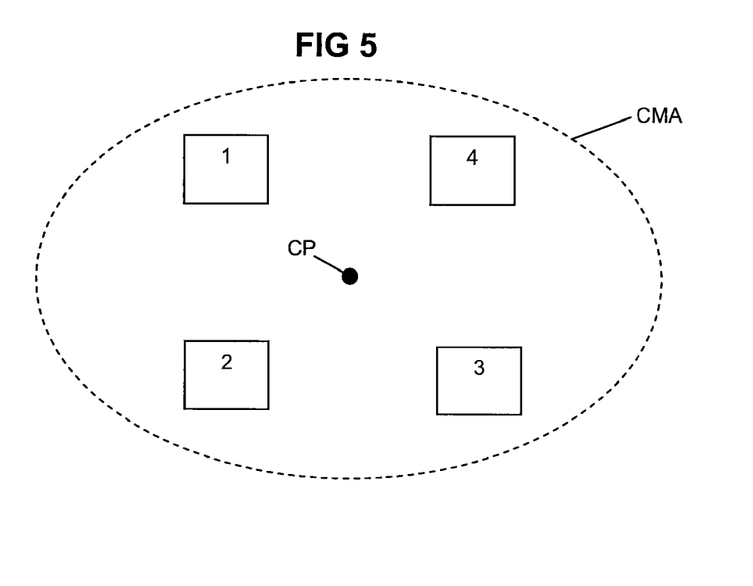
FIG. 5 depicts a common moving area with four working locations of a lithographic apparatus according to another embodiment of the invention.

FIG. 5 depicts a further example of a common moving are CMA. In this example, there are also four working locations 1, 2, 3, 4 provided which are distributed around the central point CP, also in a point-symmetrical way, but different from the embodiment of FIG. 4.

The four working locations may be configured such that two of the working locations are for exposure of substrates, and the other two working locations are for preparatory purposes.

It is noted here that the shown working locations have a rectangular shape. However, this shape can be any shape, and is corresponding to the location in which the exposure or preparatory operations can take place. It is possible, certainly when the substrate table is stationary with respect to the common moving area during the operations performed in the working location, that the shape of the working location is corresponding to the shape of the substrate table positioned in the working location in plan view, so that the working location may be a virtual image of the substrate table when positioned in the working location. The specific shape of the working location is thus not relevant for the invention.

Figure 6:
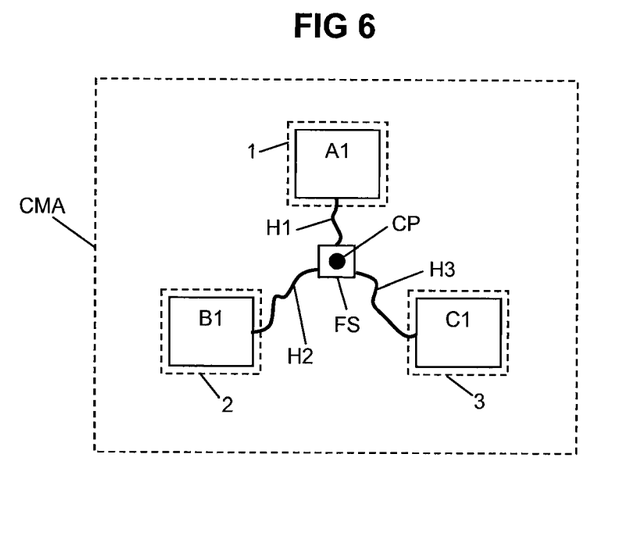
FIG. 6 depicts partially a lithographic apparatus according to yet another embodiment of the invention.

FIG. 6 depicts a part of a lithographic apparatus according to another embodiment of the invention. Shown are three substrate tables A1, B1, C1 which are moveable in a common moving area CMA. The common moving area includes three working locations 1, 2, 3. A benefit of this configuration is that each substrate table can occupy a working location at the same time as is shown in FIG. 6. This means that processes/operations performed at these working locations can be performed simultaneously, i.e. in parallel which saves time and thus increases the throughput of the lithographic apparatus.

The apparatus further includes a fixed supply FS located at the central point of the moving area. In an embodiment, the supply FS may also be limited moveable. The fixed supply may supply anything such as power, water, etc. to the substrate tables. Each substrate table is therefore connected to the fixed supply by a respective flexible cable and/or hose H1, H2, H3, which may be combined into a cable slap.

In an embodiment, electrical power is not supplied to the substrate table via a cable. This can be done by avoiding electrical power requiring components on the substrate table, for example by providing coils of a electromagnetic actuator on a frame supporting the substrate tables and permanent magnets on the substrate table, so that electrical power is only supplied to the coils which are not arranged on the substrate table. It can also be done by providing the electrical power wirelessly to the substrate table. The abovementioned principles can be applied to all embodiments of the invention.

After a process in a working location has been completed, the corresponding substrate table may move to another working location. In an embodiment, all substrate tables move to another working location at the same time, but this may not be necessary, especially not when there are more working locations than substrate tables. The flexible cables and/or hoses H1-H3 may allow for instance the substrate table A1 to move to working location 2, and subsequently in the same direction to working location 3. However, if movement would continue in the same direction around the central point, the corresponding cable and/or hose H1 would possibly wind itself around the fixed supply. Therefore, movement of the substrate table may sometimes include moving in an opposite direction around the central point to return to an initial working station. In an embodiment, during movement from one working station to another at the same, all substrate tables move in the same angular direction relative to the central point to avoid entanglement.

In an embodiment, the connection between cable and/or hose H1, H2, H3 and the fixed supply may be moveable to allow the connection to adjust itself to movement of the substrate table. In an embodiment, by allowing a rotation of the cable and/or hose about a vertical axis substantially perpendicular to the common moving area. In case of FIG. 6, the moveability is expressed as the possibility for a full rotation of the cable and/or hose about an axis extending through the central point substantially perpendicular to the plane of the moving area. In this way, the substrate tables do not necessarily have to perform subsequent movements in different directions to avoid winding and entanglement of the cables and/or hoses. The substrate table can then make one or more full rotations in both directions around the central point.

Figure 7:
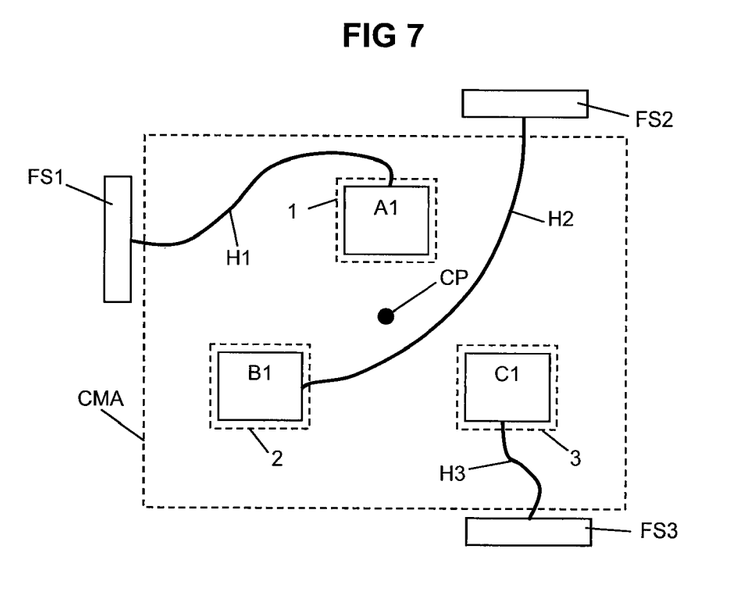
FIG. 7 depicts a first positioning phase of three substrate tables of a lithographic apparatus according to a further embodiment of the invention.

FIG. 7 depicts a part of another lithographic apparatus according to a further embodiment of the invention. Shown are three substrate tables A1, B1, C1, which are moveable in a common moving area CMA including three working locations 1, 2, 3. The substrate tables A1, B1, C1 are depicted as being positioned at respectively the three working locations, 1, 2, 3. The three working locations 1-3 are distributed around a central point CP.

The apparatus also includes a fixed or limited moveable supply to supply resources to the substrate tables. In this case, the fixed or limited moveable supply includes three sub-supplies FS1, FS2, FS3, each for one of the substrate tables. The substrate tables A1-C1 are connected to the respective sub-supplies FS1-FS3 by means of a respective cable and/or hose H1, H2, H3.

It may be required for operational purposes of the apparatus that a substrate table subsequently moves from working location 1, then to working location 2, and finally to working location 3 after which it returns to working location 1 to start the sequence all over again. In FIG. 7, each substrate table is positioned at a different working location and therefore at a different point of the process. This increases the throughput as multiple steps are performed in parallel.

Figure 8:
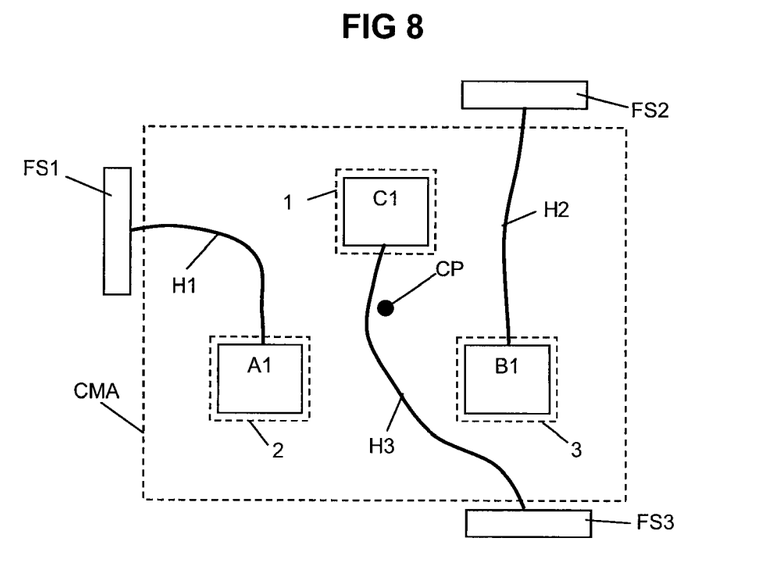
FIG. 8 depicts a second positioning phase of the three substrate tables of FIG. 7.

FIG. 8 depicts the apparatus of FIG. 7 when the substrate tables A1-C1 are positioned respectively at working location 2, 3 and 1. Movement of the substrate tables from the situation in FIG. 7 to the situation in FIG. 8 is performed such that no entanglement of the cables and/or hoses H1-H3 occurs.

Figure 9:
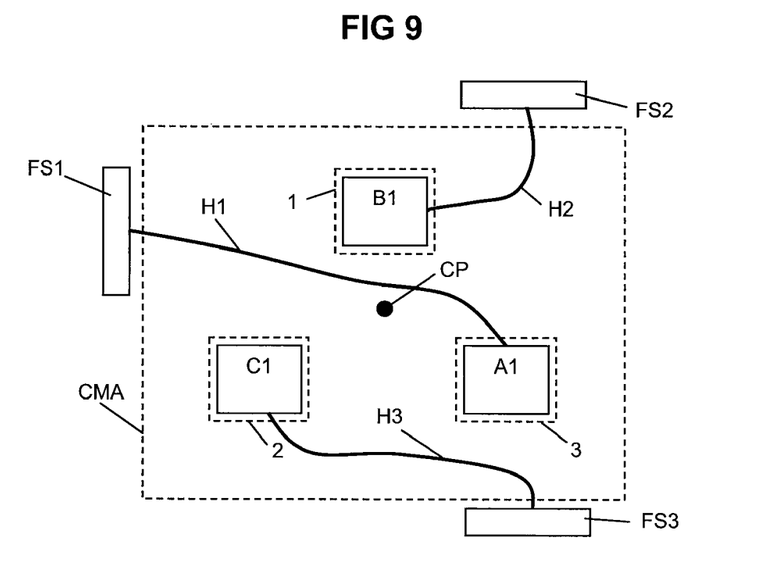
FIG. 9 depicts a third positioning phase of the three substrate tables of FIG. 7.

FIG. 9 depicts the apparatus of FIG. 7 when the substrate tables A1-C1 are positioned respectively at working location 3, 1 and 2. Movement of the substrate tables is again performed such that no entanglement of the cables and/or hoses H1-H3 occurs. After this situation, the substrate tables may return to the situation of FIG. 7.

All movements are carried out without entanglement of the cables and/or hoses H1-H3 by controlled movement of the substrate tables. Further, the cables and/or hoses H1-H3 may be positioned at different altitudes as seen in a direction substantially perpendicular to a plane defined by the common moving area CMA, so that a substrate table and cable and/or hose is able to pass below another cable and/or hose. At least one of the cables and/or hoses therefore has to extend outside the plane.

A combination of the principles in the embodiments of FIG. 6 and FIGS. 7-9 is also possible in which the sub-supplies are moveable along the perimeter of the common moving area, so that the sub-supply follows at least partially the movement of the corresponding substrate table in order to avoid entanglement. Movement of the sub-supplies can be done in a carrousel-like manner, wherein in an embodiment the mutual distances between the sub-supplies is fixed, thereby allowing to move all sub-supplies using one actuator and/or moving element, e.g. a rotating frame to which the sub-supplies are attached.

In the embodiments shown in FIGS. 2-9, the operations to be performed in the working locations may be as follows:
  in a first working location, a pattern is transferred from a patterning device onto a substrate;
  in a second working location, a substrate is exchanged between a substrate table and the substrate exchanger; and
  in a third working location, preparatory operations are performed on a substrate.

In an embodiment, a substrate table is present in each of the first, second and third working location at the same time to allow the operations to be performed in parallel. After the operations are performed, the respective substrate table in the first working location is moved to the second working location, the respective substrate table in the second working location is moved to the third working location and the respective substrate table in the third working location is moved to the first working location, wherein the movements are preferably performed simultaneously. Subsequently, the operations can be performed at the respective working locations, after which the substrate tables can be moved again, so that a sequence of performing operations at the working locations and movement of the substrate tables is provided.

When a lithographic apparatus is used for double exposure of the substrate table, i.e. the substrate is exposed twice to the patterned radiation beam, wherein the patterned radiation beam is not necessarily the same for both exposures, it is desirable to use two working locations for exposure and one working location for measuring the substrate, so that in total three substrate tables may be used to optimize the throughput. In that case, a substrate is first measured in a first working location, then subsequently moved to the next working location where it is exposed to the patterned radiation beam and finally is moved to the last working location where it is exposed to another patterned radiation beam. As there are three substrate tables, three substrates can be processed nearly parallel, making full use of the working locations and ensuring that all working locations are occupied substantially at the time.

When a lithographic apparatus is used for single exposure of the substrate table, i.e. the substrate is exposed once to the patterned radiation beam, it is desirable to use four working location of which two are arranged for exposure of the substrate and two are arranged for measuring the substrate to optimize throughput. In that case four substrate tables are desirable, so that e.g. two substrate tables are alternatingly present at one of the exposure working locations and one of the measuring working locations, and the other two substrate tables are alternatingly present at the other one of the exposure working locations and the other one of the measuring working locations. Other configurations are also possible depending on the possible entanglement of the cables and/or hoses. Having two exposure or measurement working locations may also have the advantage that during down-time of one of the exposure or measurement working locations, the other corresponding working location may take over, so that only a drop in throughput occurs, but not a full shut-down of the apparatus.

Figure 10:
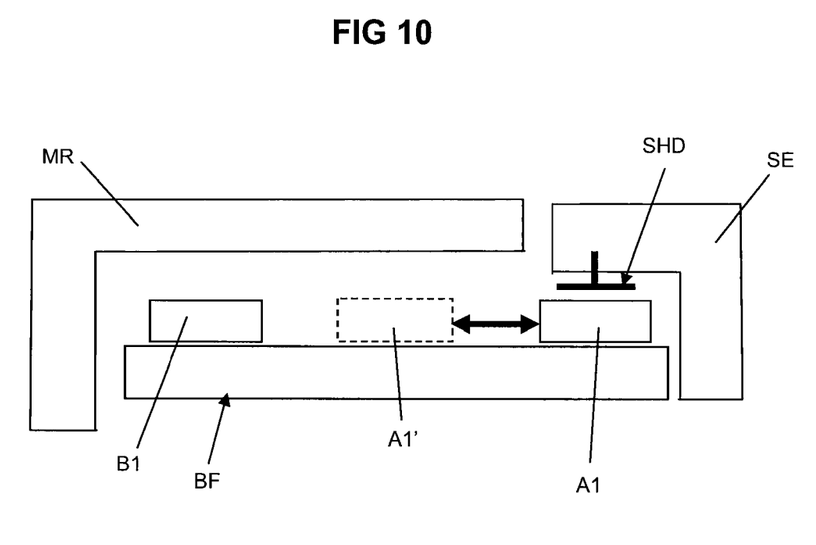
FIG. 10 depicts in side view a part of a lithographic apparatus according to yet a further embodiment of the invention.

FIG. 10 depicts schematically a part of a lithographic apparatus according to yet another embodiment of the invention. Shown are two substrate tables A1, B1 which are positioned relative to a measurement reference MR using a positioning device, e.g. an actuator, provided between the respective substrate table and a base frame BF. Movement of one substrate table is indicated by showing substrate table A1 also in a position A1' distinct from the position of substrate table A1.

The positioning device may include a coil arranged on the substrate table and permanent magnets arranged on the base frame BF. Alternatively, coils may be arranged on the base frame and permanent magnets may be arranged on the substrate table to minimize the amount of cables and/or hoses between the substrate table and the base frame or measurement reference. The configuration of the positioning device on the base frame determines the extend of movement of the substrate table, and thus a common moving area may be defined substantially parallel to the base frame in which the substrate tables are moveable. The common moving area thus extending substantially in a plane parallel to the base frame BF.

The apparatus further includes a substrate exchanger SE configured to exchange a substrate between a substrate table and the substrate exchanger while holding the respective substrate substantially stationary relative to the substrate exchanger with a substrate handling device SHD seen in a direction parallel to the plane of the common moving area.

The moving area of the substrate tables extends to the substrate exchanger so that the substrate table can move below the substrate handling device (as shown by substrate table A1).

A benefit of this configuration is that the substrate table can move towards the substrate handling device instead of the substrate handling device moving towards the substrate table as is done in prior art systems. As the substrate table can move much faster than the substrate handling device, the process can be accelerated and thus the throughput is increased.

Further, as the substrate handling device does not have to be moved towards the substrate table between the substrate table and the measurement reference, the requirements on maximum occupied space of the substrate handling device may be less strict.

The substrate table may be moved in a direction substantially perpendicular to the plane to allow the substrate table to get in touch with a substrate and/or the substrate handling device and perform the exchange. Also the substrate handling device may allow for movement in one or more directions to assist in the exchange and positioning of the substrate relative to the substrate. However, in an embodiment, these moving capabilities are small compared to the moving capabilities of the substrate table itself.

The substrate handling device may be any kind of handling device including mechanical contact grippers, vacuum grippers and/or substrate floating systems, in which the substrate is held substantially stationary without making contact with the substrate.

Although specific reference is made to substrate table, the invention also applies to substrate stages including a substrate table and positioning device to position the substrate table in which the positioning device moves along with the substrate table. Thus where appropriate, the reference to a substrate table can be replaced by substrate stage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support constructed to support a patterning device, the patterning device being capable of imparting a radiation beam with a pattern in its cross-section to form a patterned radiation beam;
   at least three substrate tables that are each constructed to hold a substrate; and
   a projection system configured to project the patterned radiation beam onto a target portion of the substrate,
   wherein the at least three substrate tables are moveable in a common moving area extending substantially in a plane substantially perpendicular to the patterned radiation beam, the moving area comprising at least three working locations of which at least one working location is arranged for exposure of the substrate to the patterned radiation beam and at least one working location is arranged for non-exposure purposes, and
   wherein the at least three substrate tables are moveable in said common area so that, in use, each of the at least three substrate tables is moveable to a position previously occupied by each of the remaining at least three substrate tables and each of the least three substrate tables is moveable to each of the at least three working locations.

2. The lithographic apparatus of claim 1, wherein at least two of the three working locations are arranged for exposure of the substrate to the patterned radiation beam and at least one working location is arranged to measure parameters of the substrate.

3. The lithographic apparatus of claim 2, wherein the parameters of the substrate include six degrees of freedom position information of the substrate relative to the respective substrate table.

4. The lithographic apparatus of claim 1, further comprising a fixed or limited moveable supply, and wherein each substrate table is connected to the fixed or limited moveable supply by a flexible cable and/or hose, the working locations being distributed substantially around a central point.

5. The lithographic apparatus of claim 4, wherein the fixed or limited moveable supply is located at a central point of the moving area.

6. The lithographic apparatus of claim 5, wherein the cable and/or hose is/are moveably connected to the fixed or limited moveable supply to allow a full rotation of the cable and/or hose about an axis extending through the central point and perpendicular to the plane.

7. The lithographic apparatus of claim 4, wherein the cable and/or hose is/are moveably connected to the fixed or limited moveable supply for adjustment to a movement of the respective substrate table.

8. The lithographic apparatus of claim 4, wherein the fixed or limited moveable supply comprises a sub-supply for each substrate table, and wherein each cable and/or hose of the respective substrate table is/are connected to its respective sub-supply, and wherein the sub-supplies are distributed around the circumference of the moving range in the plane.

9. The lithographic apparatus of claim 8, wherein each sub-supply is moveable relative to the common moving area to avoid entanglement of the cable and/or hose.

10. The lithographic apparatus of claim 1, further comprising a fixed or limited moveable supply, wherein each substrate table is connected to the fixed or limited moveable supply by a flexible cable and/or hose, and wherein at least one flexible cable and/or hose extends substantially in the plane, and at least one flexible cable and/or hose extends substantially out of the plane.

11. The lithographic apparatus of claim 1, wherein for double exposure of the substrate, three working locations and three substrate tables are provided, two of the three working locations being arranged for exposure, and the other one being arranged for non-exposure, and wherein for single exposure of the substrate, four working locations and four substrate tables are provided, two of the four working locations being arranged for exposure, and the other two being arranged for non-exposure.

12. The lithographic apparatus of claim 1, comprising a substrate exchanger configured to exchange a substrate between a substrate table and the substrate exchanger while holding the respective substrate substantially stationary relative to the substrate exchanger with a substrate handling device seen in directions parallel to the plane, wherein the moving area of the substrate tables extends to the substrate exchanger so that the substrate table can move below the substrate handling device.

13. A device manufacturing method using a lithographic apparatus of claim 12, comprising:
transferring a pattern from a patterning device onto a substrate in a first working location;
exchanging a substrate between a substrate table and the substrate exchanger in a second working location; and
performing preparatory operations on a substrate in a third working location;
wherein a substrate table is present in each of the first, second, and third working location so that the transferring, the exchanging and the performing can be performed in parallel, the method further comprising
moving the respective substrate table in the first working location to the second working location;
moving the respective substrate table in the second working location to the third working location;
moving the respective substrate table in the third working location to the first working location;
wherein the movings are performed substantially simultaneously.

14. The method of claim 13, wherein the transferring, the exchanging and the performing on the one hand and the movings on the other hand are performed sequentially.

* * * * *